(12) United States Patent
Hopkins

(10) Patent No.: US 6,198,330 B1
(45) Date of Patent: Mar. 6, 2001

(54) ADAPTIVE-LOAD INVERTERS AND METHODS

(75) Inventor: Michael Clarence Hopkins, Mebane, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/456,055

(22) Filed: Dec. 7, 1999

(51) Int. Cl.[7] .................................................. H03L 5/00
(52) U.S. Cl. ................................................... 327/333
(58) Field of Search ................................. 363/131, 132; 327/331, 333, 428, 433, 538, 543

(56) References Cited

U.S. PATENT DOCUMENTS

| | | | |
|---|---|---|---|
| 3,700,981 | * 10/1972 | Masuhara et al. | 317/235 R |
| 4,675,544 | * 6/1987 | Schrenk | 307/264 |
| 5,467,044 | * 11/1995 | Ashe et al. | 327/333 |
| 5,532,630 | * 7/1996 | Waggoner et al. | 327/108 |

OTHER PUBLICATIONS

Bogart, Theodore F., *Electronic Circuits and Devices*, Macmillan Publishing Company, New York, Third Edition 1993, pp. 336–338.

Gray, Paul R., *Analysis and Design of Analog Integrated Circuits*, Third Edition, John Wiley and Sons, New York, 1992, pp. 59–66.

* cited by examiner

*Primary Examiner*—Matthew Nguyen
(74) *Attorney, Agent, or Firm*—Koppel & Jacobs

(57) ABSTRACT

Inverters are provided which adapt their output impedance to the driven load and thereby enhance inverter performance (e.g., current drive, switching speed and common-mode rejection). An inverter embodiment includes a complementary common-source stage arranged to drive an output port in response to signals at a first side of a differential input port and a complementary common-drain stage arranged to drive the output port in response to signals at a second side of the differential input port.

13 Claims, 7 Drawing Sheets

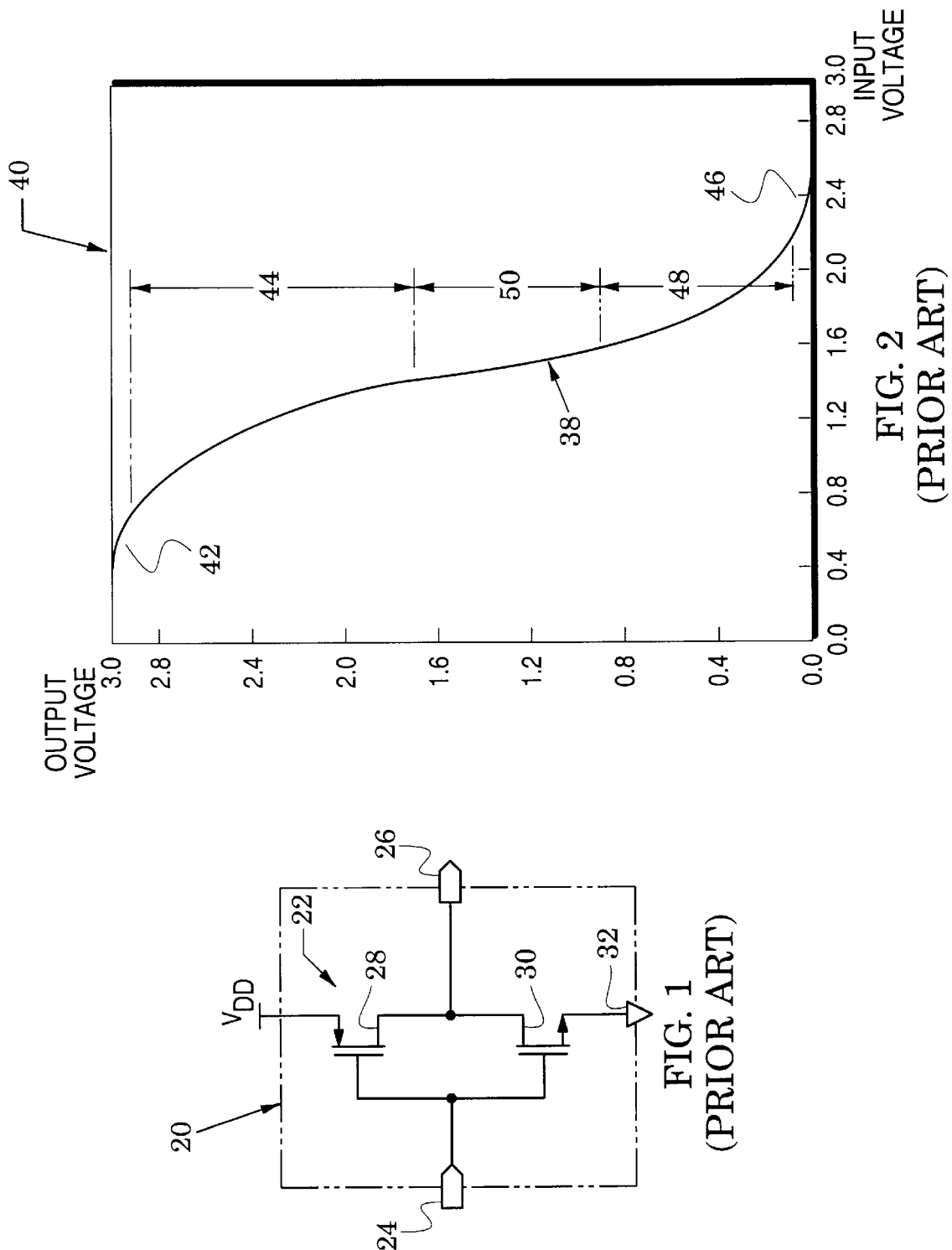

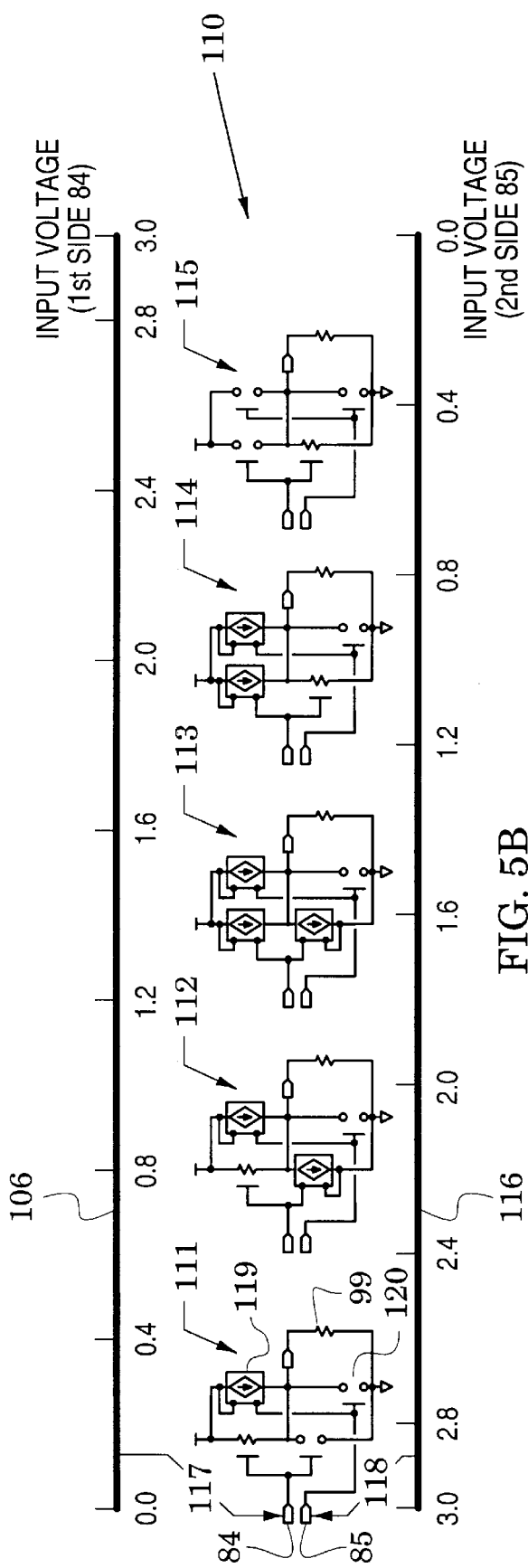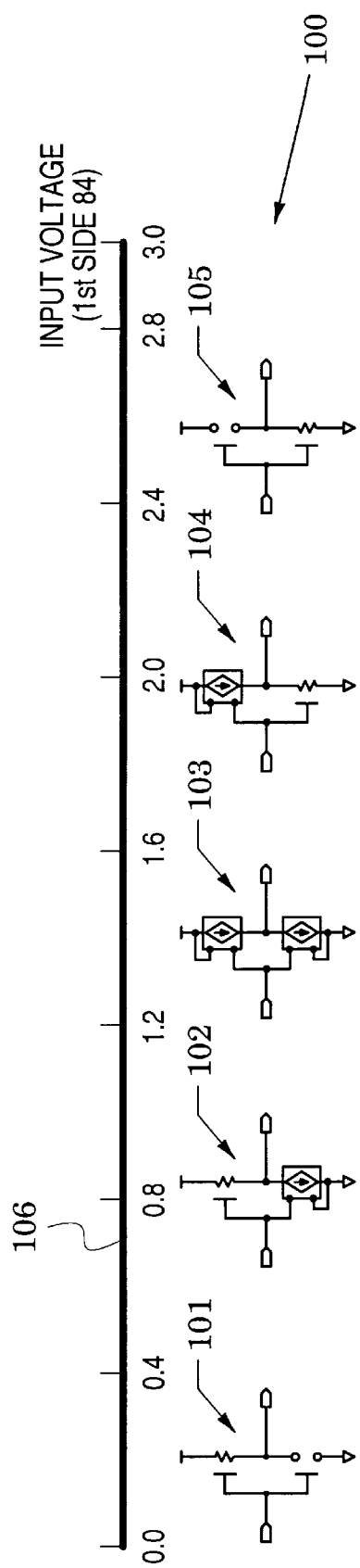
FIG. 5B
FIG. 5A

ADAPTIVE-LOAD INVERTERS AND METHODS

BACKGROUND OF THE INVENTION

1. Field of the Invention

The present invention relates generally to inverters and, more particularly, to complementary metal-oxide semiconductor inverters.

2. Description of the Related Art

FIG. 1 illustrates a conventional inverter 20 that is realized with complementary metal-oxide semiconductor (CMOS) devices. The inverter has a complementary common-source stage 22 coupled between a single-ended input port 24 and a single-ended output port 26. In more detail, the complementary common-source stage 22 includes a P-channel metal-oxide semiconductor (PMOS) transistor 28 and an N-channel metal-oxide semiconductor (NMOS) transistor 30. The transistors 28 and 30 have their gates coupled to the input port 24, their drains coupled to the output port 26 and their sources respectively coupled to a supply voltage $V_{DD}$ and a ground 32.

Various references on CMOS transistors (e.g., Gray, Paul R., et al, *Analysis and Design of Analog Integrated Circuits*, John Wiley and Sons, New York, 1993, p. 59–66), explain that a conductive channel exists between a drain and a source when a gate-to-source voltage $V_{GS}$ is greater than the threshold voltage $V_T$ and, accordingly, a drain-to-source voltage $V_{DS}$ will cause current to flow between the drain and source. When $V_{DS}$ is less than $V_{GS}-V_T$, the transistor is said to be in its triode region in which the drain current is given by $$I_D = \frac{K'}{2}\frac{W}{L}\{2(V_{GS}-V_T)V_{DS}-V_{DS}^2\} \quad (1)$$

wherein K' is the product of the channel's average electron mobility and the gate oxide capacitance per unit area and W and L are respectively the channel's width and length. In this triode region, a CMOS transistor behaves as a nonlinear voltage-controlled resistor. When $V_{DS}$ is greater than $V_{GS}-V_T$, the transistor is said to be in its saturation region in which the drain current is given by $$I_D = \frac{K'}{2}\frac{W}{L}(V_{GS}-V_T)^2 \quad (2)$$

and the transistor behaves as a voltage-controlled current source. When $V_{GS}$ is less than the threshold voltage $V_T$, a drain-to-source voltage $V_{DS}$ will not cause current to flow between the drain and source and the transistor is said to be in cutoff.

Because of this transistor behavior, the inverter 20 will generate a transfer curve 38 that is shown in the graph 40 of FIG. 2 in which $V_{DD}$ is approximately 3 volts. When the input signal (at the input port 24 of FIG. 1) is low in a first transfer-curve region 42, transistors 28 and 30 are respectively in the triode region and in cutoff so that the output signal is approximately equal to the supply voltage $V_{DD}$. An increase of input voltage places transistors 28 and 30 respectively in the triode region and in the saturation region so that a voltage drop builds across transistor 28 and the output signal begins to decrease in a transfer-curve region 44.

This behavior is reversed when the input signal is initially $V_{DD}$, forming a transfer-curve region 46, and when the input decreases from $V_{DD}$, forming a transfer-curve region 48. In the transfer-curve region 46, the transistors 28 and 30 are respectively in cutoff and in the triode region so that the output signal is substantially zero. In the transfer-curve region 48, the transistors 28 and 30 are respectively in the saturation region and in the triode region and thus a voltage drop builds across transistor 30 and the output signal begins to increase.

When the input signal is in a transfer-curve region 50 that is between transfer-curve regions 44 and 48, both transistors 28 and 30 are in their saturation region and the output signal transitions between the output signals of these two latter regions.

FIGS. 3A and 3B show graphs 60 and 62 that respectively illustrate gain and output impedance plots 61 and 63 of the inverter 20 of FIG. 1. These plots are developed with the aid of small signal models of the transistors 28 and 30 that correspond to transfer-curve regions of FIG. 2. As recited above, transistors 28 and 30 are respectively in the triode region and in cutoff when the input signal is low and these functions are respectively indicated by a voltage-controlled resistance 71 and an open circuit 72 in the small signal model 64 in FIGS. 3A and 3B. When the input signal is near $V_{DD}$, the transistors 28 and 30 are respectively in in cutoff and in the triode region as indicated by the small signal model 65 in FIGS. 3A and 3B.

The small signal model 66 demonstrates that the transistors 28 and 30 are respectively in the triode region and in the saturation region (indicated by voltage-controlled current source 73) as the input signal increases from zero. Conversely, the small signal model 67 demonstrates that the transistors 28 and 30 are respectively in the saturation region and the triode region as the input signal decreases from $V_{DD}$. Finally, the small signal model 68 indicates that the transistors 28 and 30 are both in their saturation region when the input signal is in the transfer-curve region 50 of FIG. 2.

The small signal models 64 and 65 of FIGS. 3A and 3B indicate that the output port (26 in FIG. 1) is respectively connected to $V_{DD}$ and to ground with a voltage-controlled resistor so that gain and output impedance are both low in plot portions of FIGS. 3A and 3B that respectively correspond to transfer-curve regions 42 and 46 of FIG. 2. Application arrows 74 and 75 point to the portions of the plots 61 and 63 to which the small signal models 64 and 65 respectively apply.

Voltage-controlled current sources that are coupled to ground and to $V_{DD}$ drive the output port in the small signal model 68 of FIGS. 3A and 3B. Accordingly, gain and output impedance are high in the plot portions of these figures that correspond to the transfer-curve region 50 of FIG. 2.

The small signal model 66 of FIGS. 3A and 3B couples the output port through a voltage-controlled resistor to $V_{DD}$ and through a voltage-controlled current source to ground. Conversely, the small signal model 67 couples the output port through a voltage-controlled current source to $V_{DD}$ and through a voltage-controlled resistor to ground. Accordingly, the gain and output impedance in the portions of plots 61 and 63 that correspond to transfer-curve regions 44 and 48 of FIG. 2 are both lower than in the portions of plots 61 and 63 that correspond to the transfer-curve region 50.

The plots 61 and 63 of FIGS. 3A and 3B demonstrate that gain and output impedance of the inverter 20 of FIG. 1 significantly vary with changes in input signal. These variations are characteristic of a variable current-drive device and indicate a limited ability to drive inverter loads having different impedances (in particular, low-impedance loads).

SUMMARY OF THE INVENTION

The invention is directed to improved inverters. In particular, it is directed to inverters that can adapt to loads of various impedances to thereby reduce parameter variations and enhance performance of conventional inverters.

In an adaptive-load inverter embodiment, these goals are realized with a complementary common-source stage arranged to drive an output port in response to signals at a first side of a differential input port and a complementary common-drain stage arranged to drive the output port in response to signals at a second side of the differential input port.

The complementary common-source stage functions as an inverter that responds to an input signal and the complementary common-drain stage functions as source followers that are driven by an inversion of the input signal. This structure adapts its output impedance to the driven load and enhances inverter performance (e.g., current drive, switching speed and common-mode rejection).

In another adaptive-load inverter embodiment, a complementary common-source stage is arranged to drive an output port in response to signals at a first side of a differential input port and a source follower is arranged to drive the output port in response to signals at a second side of the differential input port.

The novel features of the invention are set forth with particularity in the appended claims. The invention will be best understood from the following description when read in conjunction with the accompanying drawings.

BRIEF DESCRIPTION OF THE DRAWINGS

FIG. 1 is schematic of a conventional inverter;

FIG. 2 is a graph that illustrates a transfer curve of the inverter of FIG. 1;

FIG. 5A is a table that shows small signal models of the inverter of FIG. 1 that correspond to different portions of a range of input signals;

FIG. 5B is a table that shows small signal models of the inverter of FIG. 4 that correspond to different portions of a range of differential input signals;

DETAILED DESCRIPTION OF THE EMBODIMENTS

Figure 4:
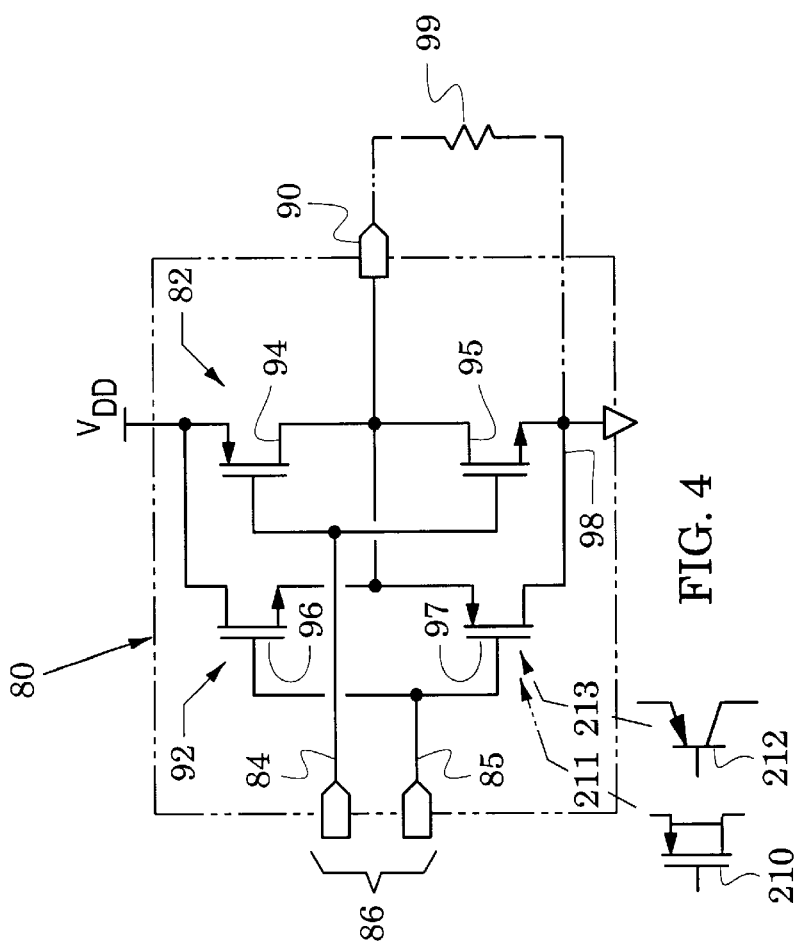
FIG. 4 is schematic of an adaptive-load inverter embodiment of the present invention.

FIG. 4 illustrates an inverter embodiment 80 which has an enhanced ability to drive different inverter loads that are represented by an exemplary load 99. In particular, the inverter 80 can adapt to changing loads and thereby reduce parameter variations (e.g., current-drive, gain and output-impedance) of conventional inverters.

The inverter 80 includes a complementary common-source stage 82 that is coupled between a first side 84 of a differential input port 86 and a single-sided output port 90 and further includes a complementary common-drain stage 92 that is coupled between a second side 85 of the differential input port 86 and the output port 90.

The complementary common-source stage 82 has first and second transistors 94 and 95 whose gates are coupled to the first side 84 and whose drains are coupled to the output port 90. The complementary common-drain stage 92 has third and fourth transistors 96 and 97 whose gates are coupled to the second side 85 and whose sources are coupled to the output port 90. The sources of the first and second transistors 94 and 95 are respectively coupled to the drains of the third and fourth transistors and are also respectively coupled to an upper supply rail in the form of a supply voltage $V_{DD}$ and to a lower supply rail in the form of a ground 98.

Figures 3A, 3B:
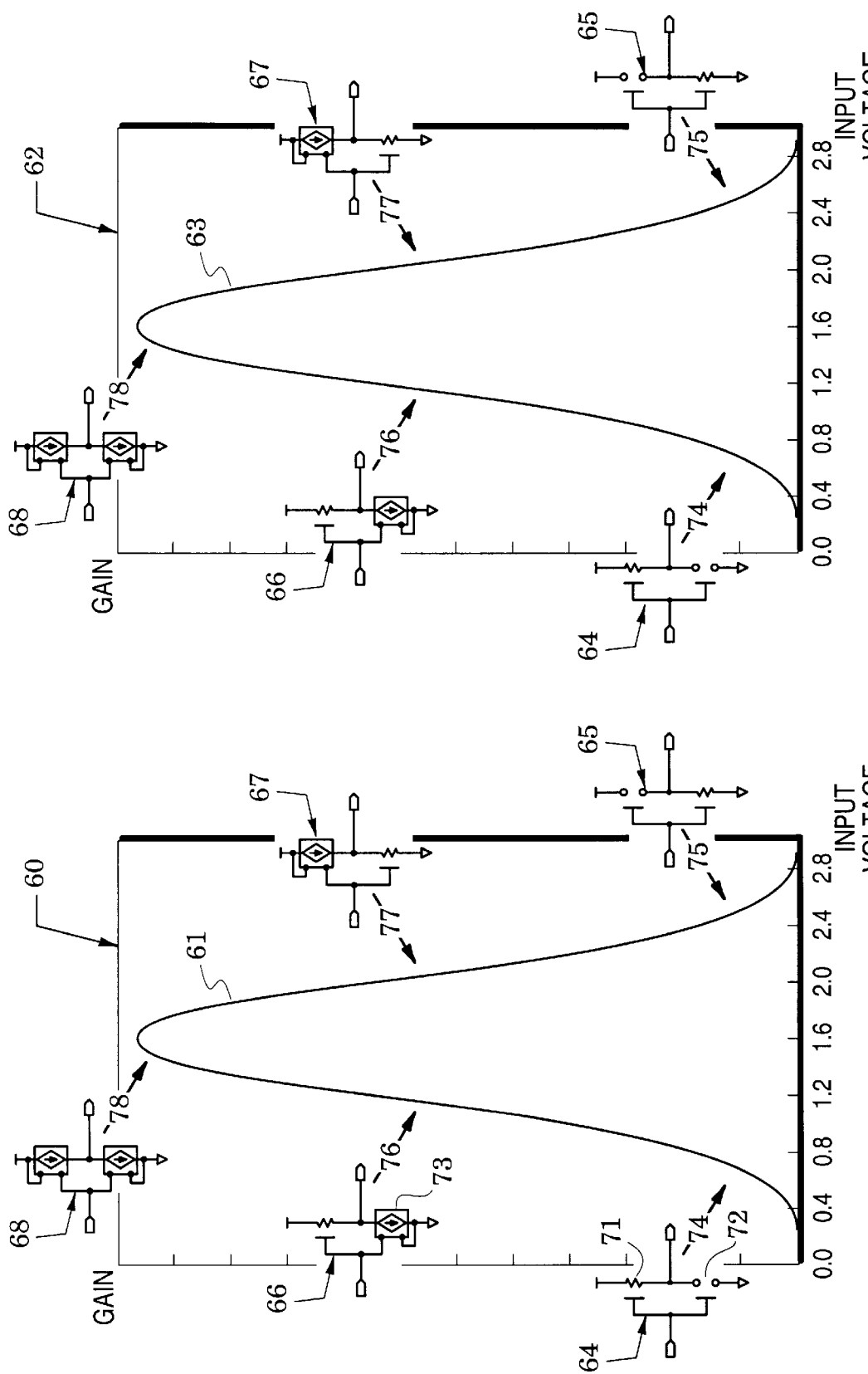
FIGS. 3A and 3B are graphs which respectively illustrate gain and output impedance of the inverter of FIG. 1.

The first and second transistors 94 and 95 respond to signals on the first side 84 of the input port 86 in a manner similar to that described with respect to the conventional inverter 20 of FIG. 1. Therefore, they can be functionally represented in the table 100 of FIG. 5A by small signal models 101, 102, 103, 104 and 105 that are respectively similar to small signal models 64, 66, 68, 67 and 65 of FIGS. 3A and 3B. FIG. 5A includes a horizontal input-voltage axis 106 that displays the input voltage on the first side 84 of the differential input port 86 of FIG. 4. Each of the small signal models is arranged in FIG. 5A to correspond to a respective portion of the axis 106.

The table 110 of FIG. 5B shows appropriate small signal models of the inverter 80 of FIG. 1 when it is directed to heavy loading conditions. These models are formed by combining the models of FIG. 5A with appropriate models of the complementary common-drain stage 92 of FIG. 4. Because the port 86 of FIG. 4 is a differential port, the voltage on its second side 85 will vary inversely to that on the first side 84. Accordingly, FIG. 5B includes the horizontal input-voltage axis 106 of FIG. 5A and an additional horizontal input-voltage axis 116 that displays respective voltages on the second side 85. In tables 100 and 110, $V_{DD}$ is assumed to be an exemplary 3 volts.

Because of the differential nature of the input port (86 in FIG. 4), the range of input signals on the horizontal input-voltage axis 106 are applied to the first side 84 of the input port as indicated by the application arrow 117 in FIG. 5B. Conversely, the inverted range of input signals on the horizontal input-voltage axis 116 are applied to the second side 85 of the input port as indicated by the application arrow 118.

When the first side 84 has an initial zero voltage (equal to the lower rail 98 of FIG. 4), the second side 85 has an initial potential of 3 volts (equal to the upper rail $V_{DD}$ of FIG. 4). For this area of input voltages, the third transistor 96 of FIG. 4 is in its saturated region and the fourth transistor 97 is in cutoff.

A small signal model 111 of FIG. 5B is therefore formed by respectively representing these transistors with a voltage-controlled current source 119 and an open circuit 120 and adding them to the small signal model 101. The resultant small signal model 111 is shown (along with the exemplary load 99 of FIG. 4) adjacent the high-voltage end of the input-voltage axis 116 (conversely, adjacent the low-voltage end of the input-voltage axis 106).

As the voltage on the second side 85 decreases from the upper rail ($V_{DD}$ in FIG. 4), the third transistor 96 remains in its saturation region until it is cutoff as the voltage reaches the lower rail (98 in FIG. 4). The fourth transistor 97 remains cutoff as the voltage decreases to the lower rail. A voltage-controlled current source and an open are therefore added to the small signal models 102, 103 and 104 to form the small signal models 112, 113 and 114 of FIG. 5B. When the voltage on the second side 85 has decreased to the lower rail (ground 98 in FIG. 4), the third and fourth transistors 96 and 97 are both in cutoff so that the small signal model 115 is formed by adding respective open circuits to the small signal model 105. The small signal models of FIG. 5B facilitate the following operational description.

In operation of the inverter 80 of FIG. 4, the complementary common-source stage 82 functions as an inverter and the complementary common-drain stage 92 functions as source followers that are driven by with an inversion of the input signal applied to the complementary common-source stage 82. The source followers are particularly effective in adapting to and driving loads of various impedances.

Figure 6:
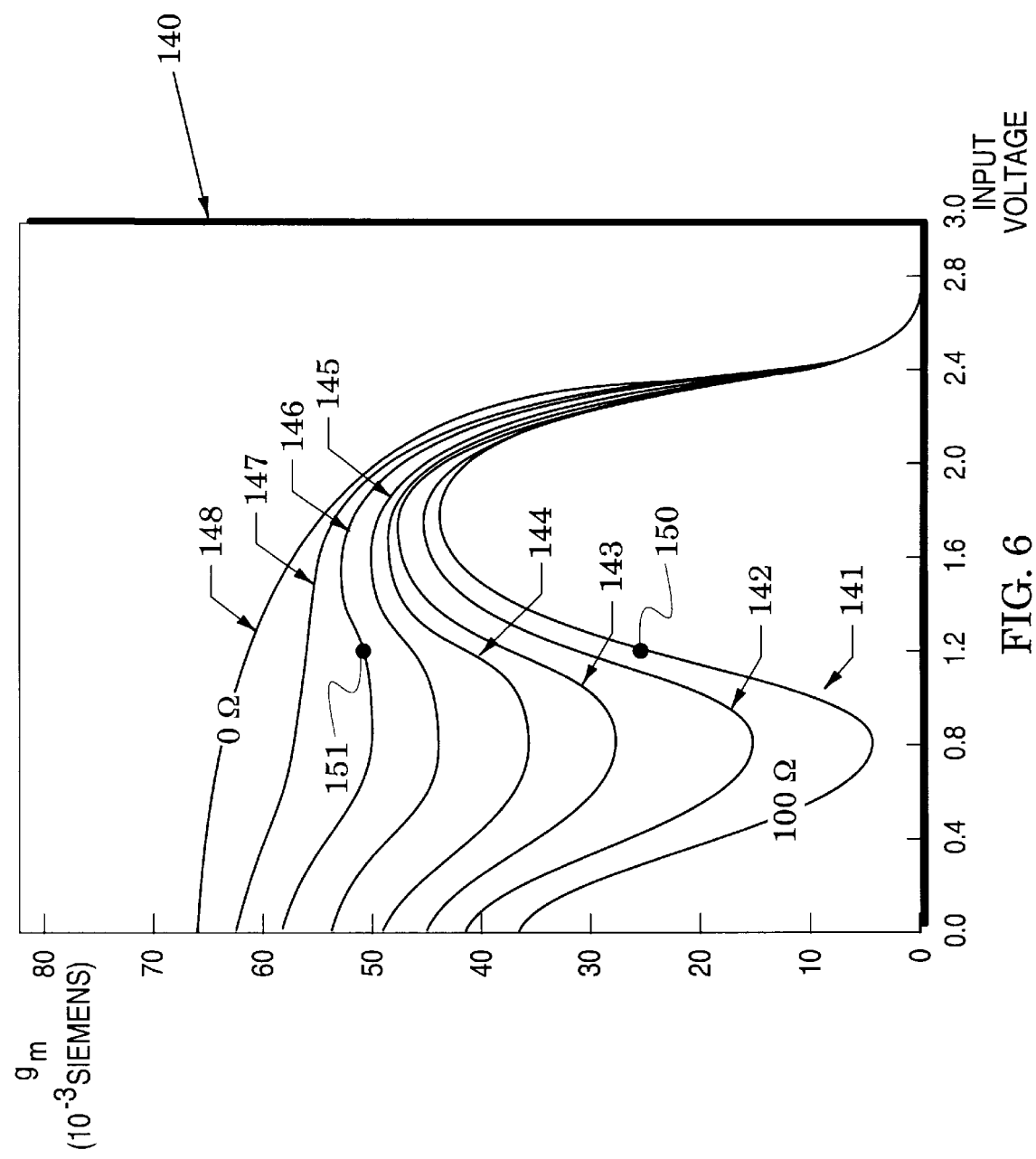
FIG. 6 is a graph of transconductance versus input voltage for one transistor of the inverter of FIG. 4.

This adaptation is exemplified by the graph 140 of FIG. 6 which was obtained by computerized simulation of the inverter 80 of FIG. 4. The graph indicates transconductance ($g_m$) plots 141–148 of the third transistor 96 of FIG. 4. Plot 141 was run with the load 99 of FIG. 4 set to approximately 100 ohms as indicated in FIG. 6. The impedance was reduced (i.e., heavier loading) for each succeeding plot until the last plot 148 was run with the load 99 of FIG. 4 set substantially to 0 ohms as also indicated in FIG. 6.

Under the heavy loading conditions of FIG. 6, the output voltage of the inverter pulls down which enables the third transistor 96 of FIG. 4 to function as a voltage-controlled current source throughout most of the input signal range as indicated by the small-signal models of FIG. 5B.

Accordingly, the graph 140 of FIG. 6 demonstrates that the third transistor 96 increases its current (i.e., transconductance increases) as heavier loads are applied. The graph is also indicative of output impedance of the inverter under heavy loading because output impedance is the inverse of transconductance. The exemplary points 150 and 151 in FIG. 6, for example, represent impedances on the order of 46 ohms and 27 ohms. The graph 140 thus illustrates that the inverter 80 of FIG. 4 adapts its output impedance to the driven load.

It is apparent from FIG. 6 that the third transistor 96 is active for all but the lowest input voltages as is also indicated by the small signal models 111–115 of FIG. 5B. Because this transistor is on and functioning as a source follower in all but the lowest input voltages, the inverter 80 of FIG. 4 is able to adapt its output impedance as the load becomes heavier (i.e., as its impedance reduces) and deliver current on demand.

Effectively, the inverter converts itself from a voltage driver for light loads (e.g., >200 ohms) to a current driver for heavy loads (e.g., <200 ohms). The inverter is inherently short circuit protected as it can drive loads of less than one ohm which can be referenced to either rail (i.e., the lower rail 98 and upper rail $V_{DD}$ of FIG. 4).

Figure 7:
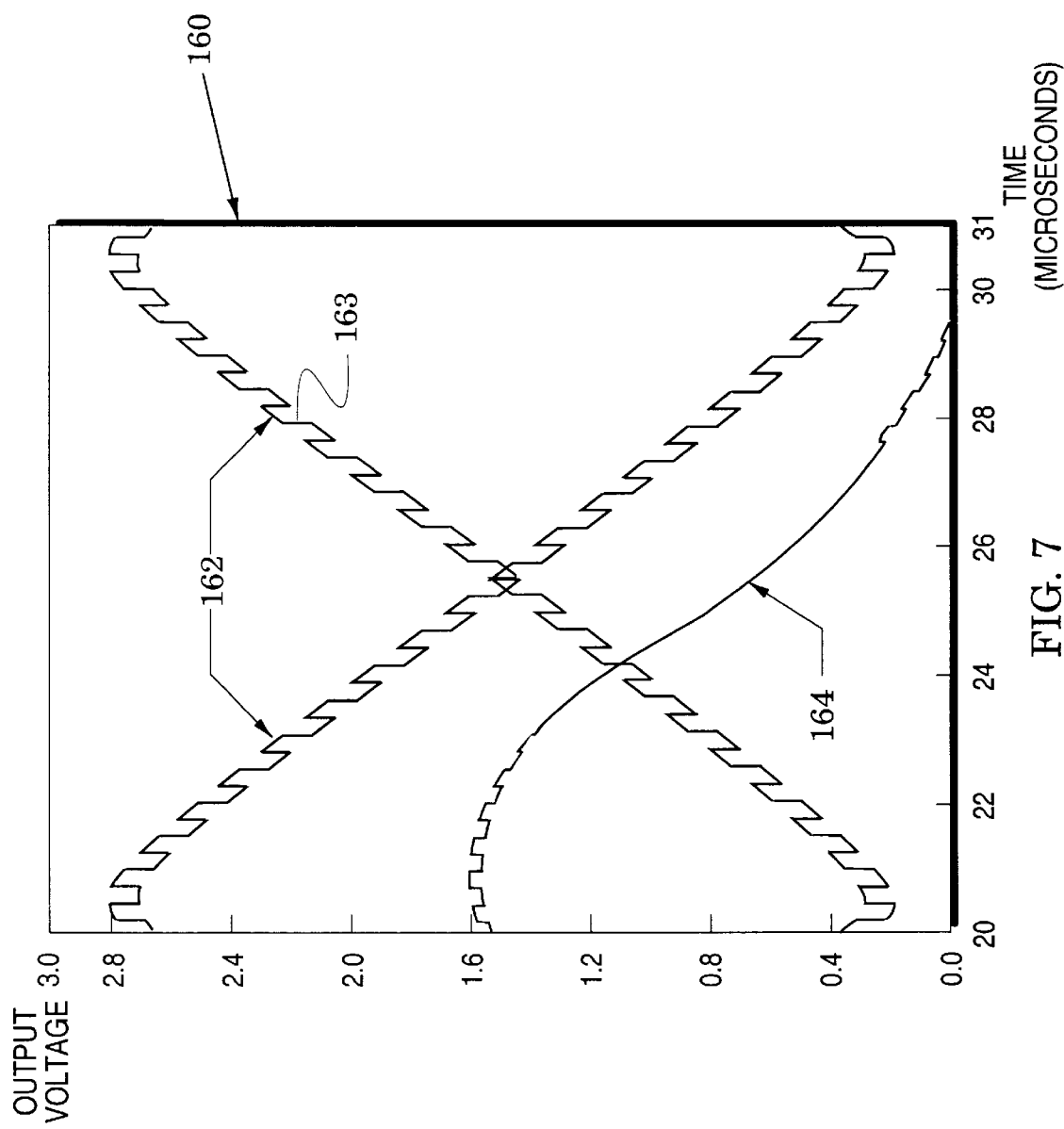
FIG. 7 is a graph that demonstrates common-mode rejection in the inverter of FIG. 4.

Adaptive-load inverters of the invention are also effective in rejection of common-mode signals. The graph 160 of FIG. 7 is a computerized simulation in which a differential signal 162 was applied to the inverter 80 of FIG. 4 (at differential input port 86). A square-wave disturbance 163 was injected into each side of the differential input signal. The resultant output signal 164 (at output port 90 of FIG. 4) demonstrates substantial rejection of the disturbance signal. The output signal 164 also demonstrates that the output amplitude reduces under heavy loading.

When the inverter 80 of FIG. 4 is provided with a light load (e.g., >200 ohms), the output signal amplitude increases and the transition between its upper and lower levels becomes sharper. This exemplifies its operation when used as a logic inverter. Under these light loading conditions and higher output signal amplitude, the gate-to-source voltage of the third transistor 96 of FIG. 4 is only able to place this transistor in saturation in the transfer-curve region 48 of FIG. 2. Under the same conditions, the gate voltage and output signal (source voltage) are such as to place the fourth transistor 97 in saturation in the transfer-curve region 44 of FIG. 2.

Figure 8:
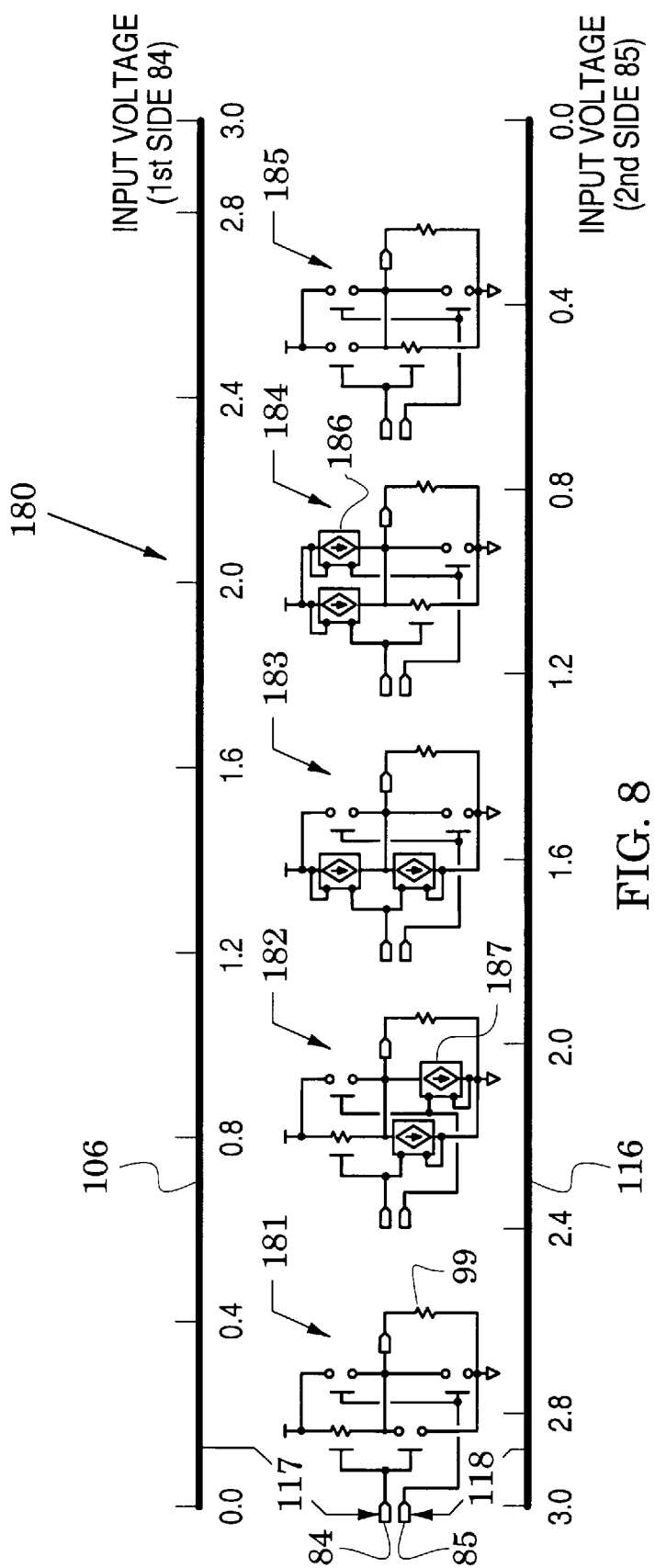
FIG. 8 is a table similar to the table of FIG. 5B except that it illustrates small signal models of the inverter of FIG. 4 under light loading conditions.

The small signal models of the inverter 80 of FIG. 4 thus change from those shown in FIG. 5B for heavy loads to those shown in FIG. 8 for light loads. FIG. 8 is similar to FIG. 5B with like elements indicated by like reference numbers. It replaces, however, the small signal models of FIG. 5B with small signal models 181, 182, 183, 184 and 185. As described above, these models differ in that the third transistor (96 in FIG. 4) is represented by an open in all models except model 184 where it is a voltage-controlled current source 186. The models also differ in that the fourth transistor (97 in FIG. 4) is represented by an open in all models except model 182 where it becomes a voltage-controlled current source 187.

Under light loads, the inverter 80 of FIG. 4 enhances the charging and discharging of the output port 90. Small signal model 181 shows that the output port is charged through the voltage-controlled resistance of the first transistor (94 in FIG. 4) and small signal model 185 shows that the output port is discharged through the voltage-controlled resistance of the second transistor (95 in FIG. 4).

In addition, small signal model 182 shows that the signal at the output port is pulled down via the voltage-controlled current source of the fourth transistor (97 in FIG. 4) and small signal model 184 shows that the voltage-controlled current source of the third transistor (96 in FIG. 4) also provides current to move the output port signal. Adaptive-load inverters of the invention thereby enhance the charging and discharging of their output ports.

Figure 9:
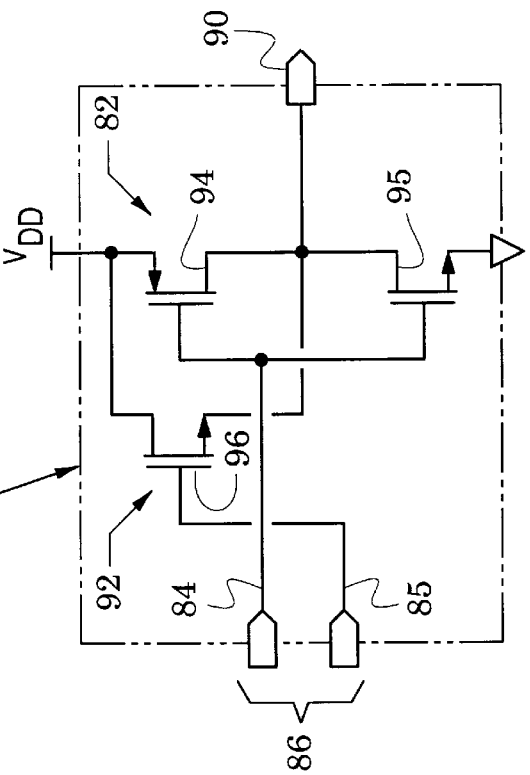
FIG. 9 is a schematic of another adaptive-load inverter embodiment.

Because the third transistor 96 of FIG. 4 is particularly effective in delivering current to the output port under heavy loading conditions, another useful inverter embodiment is formed by combining this transistor and a complementary common-source stage as shown in FIG. 9. The adaptive-load inverter 200 of this figure is similar to the inverter 80 of FIG. 4 with like elements indicated by like reference numbers. The inverter 200 differs by eliminating the fourth transistor 97 of FIG. 4.

The adaptive-load inverter 80 of FIG. 4 is an exemplary structure that can realize the inverter methods of the invention which generate an inverter output signal at an output port in response to a differential input signal with process steps that include, a) complementarily driving the output port with transistor drains in response to a first side of the differential input signal, and b) complementarily driving the output port with transistor sources in response to a second side of the differential input signal.

Similar to conventional inverters, the adaptive-load inverters of the invention can be used as logic elements that typically would drive light loads (e.g., >200 ohms) and deliver phase-inverted signals. They may also be used as linear amplifiers that would be especially useful in driving heavy loads (e.g., <200 ohms).

As shown above, these adaptive-load inverters adapt their output impedances to the driven load. They provide additional current sources (e.g., as indicated by the small-signal models of FIG. 8) that enhance the charging and discharging of an output port so that inverter speed is also enhanced. As shown by the output signal 164 of FIG. 7, they also enhance inverter common-mode rejection (e.g., rejection of correlated noise).

Transistor arrangements such as the stage 82 of FIG. 4 are generally referred to as complementary stages because they include devices of opposite polarity (e.g., an NMOS and a PMOS device) that are arranged to source and sink currents (i.e., they exhibit a push-pull capability). They are also often referred to as complementary common-source stages because each of the opposite-polarity devices has its source coupled in common with the stage's input and output circuits. In accordance with this nomenclature standard, transistor arrangements such as the stage 92 of FIG. 4 are generally referred to as complementary common-drain stages.

Although the inverters of the invention have been described with reference to particular polarities of CMOS transistors, it is apparent that other embodiments can be formed by reversal of these polarities (e.g., by substituting NMOS devices for PMOS devices and vice versa) and that these embodiments are embraced by the following claims.

Inverters of the invention are particularly suited for realization with CMOS transistors on a common substrate. In such realizations, it is customary to obtain isolation by coupling selected transistor leads to the common substrate. These isolation couplings have not been shown in the drawing figures as their implementation is well known and generally varies with each specific realization.

Although the invention has been illustrated with reference to enhancement-mode CMOS transistors, the teachings of the invention can be practiced with any transistors that have current terminals which are responsive to control terminals. For example, depletion-mode CMOS transistors and bipolar junction transistors can be substituted as exemplified by depletion-mode CMOS transistor 210 and bipolar junction transistor 212 and substitution arrows 211 and 213 in FIG. 4. In the latter case, the complementary common-source and complimentary common-drain stages would change to complementary common-emitter and complimentary common-collector stages Transfer curves such as the curve 164 of FIG. 7 have been obtained with computerized simulations. It is noted that these curves may also be obtained by using the triode and saturation equations (1) and (2) above in accordance with, for example, the small signal models of FIG. 5B and solving the resulting equations (e.g., solving iteratively) to obtain output voltage.

The embodiments of the invention described herein are exemplary and numerous modifications, dimensional variations and rearrangements can be readily envisioned to achieve equivalent results, all of which are intended to be embraced within the scope of the appended claims.

I claim:

1. An inverter, comprising:
   first and second transistors having gates that are coupled together to form a first side of a differential input port and having drains that are coupled together to form an output port; and
   a third transistor having a gate coupled to a second side of said differential input port, having a source coupled to said output port and having a drain coupled to a source of said first transistor.

2. The inverter of claim 1 wherein at least one of said first, second and third transistors is an enhancement-mode metal-oxide semiconductor transistor.

3. The inverter of claim 1 wherein at least one of said first, second and third transistors is a depletion-mode metal-oxide semiconductor transistor.

4. An inverter arranged between a differential input port and a single-ended output port, comprising:
   a complementary common-source stage arranged to drive said output port in response to signals at a first side of said differential input port; and
   a complementary common-drain stage arranged to drive said output port in response to signals at a second side of said differential input port.

5. The inverter of claim 4 wherein:
   said complementary common-source stage is formed of first and second transistors whose gates are coupled to said first side and whose drains are coupled to said output port;
   said complementary common-drain stage is formed of third and fourth transistors whose gates are coupled to said second side and whose sources are coupled to said output port; and
   sources of said first and second transistors are respectively coupled to drains of said third and fourth transistors.

6. The inverter of claim 5 wherein at least one of said first, second, third and fourth transistors is an enhancement-mode metal-oxide semiconductor transistor.

7. The inverter of claim 5 wherein at least one of said first, second, third and fourth transistors is a depletion-mode metal-oxide semiconductor transistor.

8. An inverter, comprising:
   first and second transistors having gates that are coupled together to form a first side of a differential input port and having drains that are coupled together to form an output port; and
   third and fourth transistors having gates that are coupled together to form a second side of said differential input port, having sources that are coupled to said output port and having drains that are respectively coupled to sources of said first and second transistors.

9. The inverter of claim 8 wherein at least one of said first, second, third and fourth transistors is an enhancement-mode metal-oxide semiconductor transistor.

10. The inverter of claim 8 wherein at least one of said first, second, third and fourth transistors is a depletion-mode metal-oxide semiconductor transistor.

11. An inverter arranged between a differential input port and a single-ended output port, comprising:
   a complementary common-emitter stage arranged to drive said output port in response to signals at a first side of said differential input port; and
   a complementary common-collector stage arranged to drive said output port in response to signals at a second side of said differential input port.

12. A method of generating an inverter output signal at an output port in response to a differential input signal, the method comprising the steps of:
   complementarily driving said output port with transistor drains in response to a first side of said differential input signal; and
   complementarily driving said output port with transistor sources in response to a second side of said differential input signal.

13. A method of generating an inverter output signal at an output port in response to a differential input signal, the method comprising the steps of:
   complementarily driving said output port with transistor collectors in response to a first side of said differential input signal; and
   complementarily driving said output port with transistor emitters in response to a second side of said differential input signal.

* * * * *